United States Patent
Wu et al.

(10) Patent No.: US 7,613,538 B2
(45) Date of Patent: Nov. 3, 2009

(54) COMPENSATION FOR DISTORTION IN CONTACT LITHOGRAPHY

(75) Inventors: Wei Wu, Palo Alto, CA (US); Duncan Stewart, Palo Alto, CA (US); Shih-Yuan Wang, Palo Alto, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 502 days.

(21) Appl. No.: 11/492,365

(22) Filed: Jul. 24, 2006

(65) Prior Publication Data

US 2008/0021587 A1    Jan. 24, 2008

(51) Int. Cl.
*G06F 19/00* (2006.01)
*G06F 7/00* (2006.01)
*G01R 23/20* (2006.01)
*H03K 4/90* (2006.01)
*G21K 5/00* (2006.01)
*G02F 1/1335* (2006.01)

(52) U.S. Cl. ............... 700/120; 700/97; 700/98; 700/118; 700/119; 700/163; 324/620; 327/133; 327/317; 349/4; 378/34; 378/35

(58) Field of Classification Search ............ 700/97, 700/120, 98, 118–119, 163; 264/393, 3–4; 216/40–41; 324/612, 620; 327/551, 133, 327/317; 349/4; 378/34–35
See application file for complete search history.

(56) References Cited

U.S. PATENT DOCUMENTS

| | | | |
|---|---|---|---|
| 6,780,659 B2* | 8/2004 | Ashida | 438/16 |
| 6,921,615 B2* | 7/2005 | Sreenivasan et al. | 430/22 |
| 7,077,992 B2* | 7/2006 | Sreenivasan et al. | 264/496 |
| 7,157,036 B2* | 1/2007 | Choi et al. | 264/264 |
| 7,195,733 B2* | 3/2007 | Rogers et al. | 264/496 |
| 7,292,326 B2* | 11/2007 | Nimmakayala et al. | 356/139.04 |
| 2004/0042094 A1* | 3/2004 | Matsuyama | 359/822 |
| 2005/0046813 A1* | 3/2005 | Streefkerk et al. | 355/30 |
| 2005/0238967 A1 | 10/2005 | Rogers et al. | |
| 2006/0180952 A1 | 8/2006 | Kruijt-Stegeman et al. | |
| 2008/0204682 A1* | 8/2008 | Uehara et al. | 355/46 |

FOREIGN PATENT DOCUMENTS

| | | |
|---|---|---|
| JP | 2005199625 | 7/2005 |
| WO | 2004054784 | 7/2004 |
| WO | 2006080757 | 6/2006 |
| WO | 2007013554 | 2/2007 |

OTHER PUBLICATIONS

PCT International Search Report; International Application No. PCT/US2007/016580; Applicant Hewlett-Packard Development Company, L.P.; Form PCT/ISA/210.

* cited by examiner

*Primary Examiner*—Ramesh B Patel (57) ABSTRACT

A method of contact lithography includes predicting distortions likely to occur in transferring a pattern from a mold to a substrate during a contact lithography process; and modifying the mold to compensate for the distortions. A contact lithography system includes a design subsystem configured to generate data describing a lithography pattern; an analysis subsystem configured to identify one or more distortions likely to occur when using a mold created from the data; and a mold modification subsystem configured to modify the data to compensate for the one or more distortions identified by the analysis subsystem.

20 Claims, 5 Drawing Sheets

COMPENSATION FOR DISTORTION IN CONTACT LITHOGRAPHY

BACKGROUND

Imprint lithography or nanoimprint lithography is a methodology for forming micro-scale and nano-scale structures on a substrate. Imprint lithography involves direct contact between a patterning tool (e.g., a mold, mask, template, etc.) and a substrate on which the structures are to be fabricated. The patterning tool is aligned with the substrate and then brought into contact with a surface of the substrate with some force. Consequently, the pattern of the patterning tool is imprinted on or impressed into a receiving surface of the substrate. The characteristics of the patterning tool largely determine the quality of the final structures and the fidelity of those structures to the desired pattern.

Unfortunately, during the imprint process, distortions often occur in the pattern as transferred to the receiving surface of the substrate. Mechanical deformations of the mold or substrate during the imprint process may distort the structures formed. For example, the flexure of a patterned region may cause patterns to become blurred, shifted, weakened, or otherwise distorted. Also, the shape, size, and density of features in a patterned area may limit the flow of photoresist or other chemicals used to form the structures, thereby causing the structures to be inconsistent, flawed, or absent.

SUMMARY

A method of contact lithography includes predicting distortions likely to occur in transferring a pattern from a mold to a substrate during a contact lithography process; and modifying the mold to compensate for the distortions. A contact lithography system includes a design subsystem configured to generate data describing a lithography pattern; an analysis subsystem configured to identify one or more distortions likely to occur when using a mold created from the data; and a mold modification subsystem configured to modify the data to compensate for the one or more distortions identified by the analysis subsystem.

BRIEF DESCRIPTION OF THE DRAWINGS

The accompanying drawings illustrate various embodiments of the principles being described in this specification and are a part of the specification. The illustrated embodiments are merely examples and do not limit the scope of the principles described herein.

Throughout the drawings, identical reference numbers designate similar, but not necessarily identical, elements.

DETAILED DESCRIPTION

The following specification describes various methods and systems for reducing or eliminating the distortion that occurs between a desired pattern and the pattern actually produced by a contact lithography system. The following exemplary methods and systems enhance the fidelity of contact lithography, particularly imprint lithography, patterns produced on a substrate by predicting distortions that will occur during the lithography process and compensating for those distortions during the design and creation of the patterning tool or mold.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

As described above, imprint lithography involves direct contact between a patterning tool and a substrate on which the structures are to be fabricated. For simplicity, the patterning tool will be referred to below as a "mold." The mold is aligned with the substrate and then brought into contact with a surface of the substrate with some force. Consequently, the pattern of the patterning tool is imprinted on or impressed into a receiving surface of the substrate. As used in this specification and the appended claims, a "mold" is a member of an imprint lithography system that bears a pattern which is imprinted into the surface of a substrate.

Unfortunately, distortion in the imprinted pattern in an imprint lithography system can results from any of a variety of factors. These factors include, but are not limited to, deformation of a patterning tool or substrate during imprinting, differential temperatures among system components, temperature changes, thermal expansion, stress, and fluid flow effects. Any of these factors, or a combination of any of these factors, can decrease the quality of an imprinted pattern.

However, potential defects can be predicted through simulation and analysis of a desired pattern and mold design, allowing the final mold design to compensate for the predicted distortions. Thus, the final mold design from which the actual mold is fabricated is based on the desired pattern to be transferred with adjustments or modifications to the pattern to compensate for the predicted distortions that will occur during the imprinting process. This concept may be referred to as "design for manufacturability." The adjustments made to a mold design can correct for distortions that inherently occur in a given lithography process and for distortions and flaws that may arise from the pattern design itself.

As used in the present specification, the terms "subsystem" and "module" shall be used interchangeably to include any number of hardware, software, firmware components, or any combination thereof. As used in the present specification, the subsystems and modules may be a part of or hosted by one or more computing devices including, but in no way limited to, servers, personal computers, personal digital assistants, or any other processor containing apparatus. Various subsystems and modules may perform differing functions or roles and together remain a single unit, program, device, or system.

As used herein and in the appended claims, the term "deformation" refers to both a plastic deformation and an elastic deformation. As used herein, "plastic deformation" means an essentially non-reversible, non-recoverable, permanent change in shape in response to an applied force. For example, a "plastic deformation" includes a deformation resulting from a brittle fracture of a material under normal stress (e.g., a cracking or shattering of glass) as well as plastic deformations that occur during shear stress (e.g., bending of steel or molding of clay). Also, as used herein, "elastic deformation" means a change in shape in response to an applied force where the change in shape is essentially temporary and/or generally reversible upon removal of the force. The term "flexure" is considered herein to have the same meaning as "deformation," and the terms are used interchangeably, as are "flex" and "deform," "flexible" and "deformable," and "flexing" and "deforming," or the like.

As used herein and in the appended claims, the term "deformation" further generally includes within its scope one or both of a passive deformation and an active deformation. Herein, "passive deformation" refers to deformation that is directly responsive to an applied deforming force or pressure. For example, essentially any material that can be made to act in a spring-like manner either by virtue of a material characteristic and/or a physical configuration or shape may be passively deformable. As used herein, the term "active deformation" refers to any deformation that may be activated or initiated in a manner other than by simply applying a deforming force. For example, a lattice of a piezoelectric material undergoes active deformation upon application of an electric field thereto independent of any applied deforming force. A thermoplastic that does not deform in response to an applied deforming force until the thermoplastic is heated to a softening point is another example of active deformation.

Further, as used herein and in the appended claims, the term "contact lithography" generally refers to any lithographic methodology that employs a direct or physical contact between a patterning tool or means for providing a pattern and a substrate or means for receiving the pattern, including a substrate having a pattern receiving layer thereon. Specifically, 'contact lithography' as used herein includes, but is not limited to, any form of photographic or X-ray contact lithography, imprint lithography and mold/resist lithography. In imprint lithography, a mold imprints a desired pattern into the surface of a substrate. Imprint lithography, as well as a variety of applicable imprinting materials, are described in U.S. Pat. No. 6,294,450 to Chen et al. and U.S. Pat. No. 6,482,742 B1 to Chou, both of which are incorporated herein by reference. In mold/resist lithography, a mold is applied in contact with a substrate and a resist is allowed to flow into and through the mold and is then hardened to form a desired pattern on the substrate.

For simplicity in the following discussion, no distinction is made between the substrate and any layer or structure on the substrate (e.g., a photoresist layer or imprintable material layer) unless such a distinction is helpful to the explanation. Consequently, reference herein is generally to the "substrate" irrespective of whether a resist layer or an imprintable material layer is or is not employed on the substrate to receive the pattern. One of ordinary skill in the art will appreciate that a resist or imprintable material layer may always be employed on the substrate of any contact lithography methodology according to the principles being described herein.

As used herein and in the appended claims, the term "resist" generally refers to any material or chemical, whether in solid, liquid, or gaseous form, that may be used to receive a pattern. The resist layer may be temporary or permanent, and may be shaped by a number of factors including, but not limited to, light, heat, temperature, pressure, or displacement.

Figure 1:
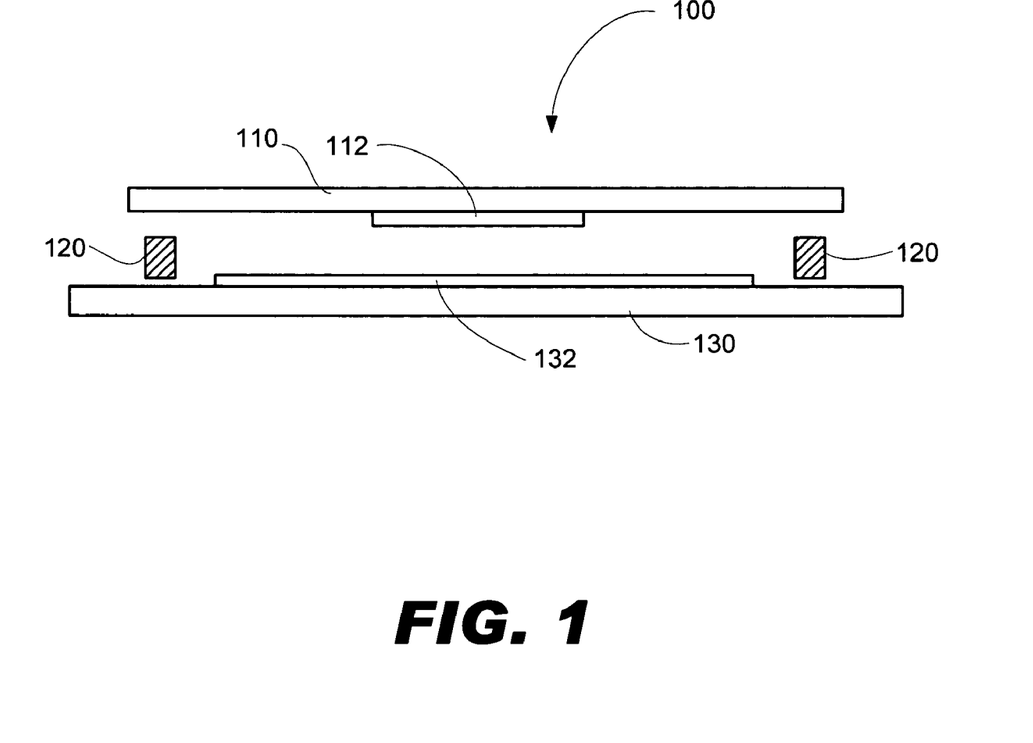
FIG. 1 is a schematic side view of a contact lithography apparatus according to one exemplary embodiment.

FIG. 1 illustrates a side view of a contact lithography apparatus (100) according to one exemplary embodiment. In the example of FIG. 1, the contact lithography apparatus (100) comprises a patterning tool or mold (110). The contact lithography apparatus (100) imprints or otherwise transfers a pattern from the mold (110) to a substrate (130). In particular, a direct contact between the mold (110) and the substrate (130) is employed during pattern transfer. A patterned area (112) of the mold (110) comes in contact with target portion (132) of a substrate (130) and the desired pattern is transferred to the target portion (132).

As used herein, 'target portion' or 'target area' refers to that portion of the substrate (110) that receives a copy of a mold pattern as represented by the patterned area (112) of the mold (110). The target portion (132) may include a pattern receiving layer such as a photoresist layer or layer of plastically deformable material specifically configured to receive the pattern of the patterning tool (110). In some cases, the target portion (132) may be heated or otherwise prepared to receive the transferring pattern.

In some examples of a contact lithography apparatus (100), spacers (120) are located between the patterning tool (110) and the substrate (130) prior to and during pattern transfer. The spacers (120) provide for and maintain an essentially parallel and proximal separation between the patterning tool (110) and the substrate (130). Some embodiments, however, do not employ spacers. Where spacers are used, in order for the patterning tool (110) to contact the substrate (130) despite the presence of the spacers (120), one or more of the several elements must deform to allow the desired contact. Consequently, deformation of one or more of the patterning tool (110), the spacers (120), and the substrate (130) allows the patterning tool (110) to contact the substrate (130) and permits the transfer of the pattern from the tool (110) to the substrate (130). For example, in some embodiments, one or both of a flexible patterning tool (110) and a flexible substrate (130) are employed. In other embodiments, deformable (e.g., collapsible) spacers (120) are employed. In yet other embodiments, a combination of a flexible patterning tool (110), a flexible substrate and/or deformable spacers (120) are employed. In some embodiments, rigidity may be provided by a plate or carrier that supports one or both of the patterning tool (110) and substrate (130) during pattern transfer. Pattern transfer occurs while the patterning tool (110) and the substrate (130) are in direct contact as a result of the flexure and/or deformation of elements of the system.

In some embodiments, especially where flexure of one or both of the mold (110) and the substrate (130) is employed, the contact between the tool (110) and substrate (130) may occur between the spacers (120) or in a region encompassed or bounded by the spacers (120). For example, the spacers (120) may be located at a periphery of a patterned region of the mold (and/or an area to be patterned of the substrate) and the flexure of the mold (110) and/or the substrate (130) occurs within that periphery.

The spacers (120) illustrated in FIG. 1 are outside of the patterned area (112) of the mold (110). Similarly, the spacers (120) are located outside of the target portion (132) of the substrate (130) as well as outside the patterned area (112) of the mold (110).

In some embodiments, for example, when a deformable spacer or spacers (120) are employed, an essentially non-deformable mold (110) and/or an essentially non-deformable substrate (130) may be used. For example, a semi-rigid or rigid mold (110) that is not deformed or not intended to be deformed during pattern transfer may be used as the mold (110). Furthermore, when using the deformable spacer or spacers (120), one or more of the spacers (120) may be located within a broader patterned area or region. For example, the substrate (130) may be a wafer having a plurality of individual dies or chips defined thereon. The dies have respective local patterned areas. In this example, deformable spacers (120) may be located in spaces or regions between the local patterned areas of the wafer substrate (130). Spaces or regions between local patterned areas include, but are not limited to, 'streets' or 'saw kerfs' separating the individual dies on the wafer substrate (130). In some embodiments, the spacers (120) are components separate from either the mold (110) or the substrate (130). In such embodiments, the spacers (120) are generally positioned, placed, or otherwise inserted between the mold (110) and the substrate (130) prior to establishing contact between the mold (110) and substrate (130) for the pattern transfer.

In other embodiments, the spacers (120) are formed as an integral part of one or both of the mold (110) and the substrate (130). For example, the spacers (120) may be fabricated as extensions of, or an integral part of, the mold (110) in some embodiments. In other embodiments, the spacers (120) may be fabricated as extensions of, or an integral part of, the substrate (130). In yet other embodiments, some of the spacers (120) may be formed as an integral part of one or both of the mold (110) and the substrate (130) while others of the spacers (120) are not integral to either the mold (110) or the substrate (130).

In some embodiments, the spacers (120) that are integral to either the mold (110) or the substrate (130) are formed by depositing or growing a material layer on a respective surface of either the mold (110) or the substrate (130). For example, a silicon dioxide ($SiO_2$) layer may be either grown or deposited on a surface of a silicon (Si) substrate (130). Selective etching of the deposited or grown $SiO_2$ layer may be employed to define the spacers (120), for example, resembling stand-off posts. In some embodiments, a uniform height of each of the stand-off post spacers (120) is established by virtue of a simultaneous growth or deposition of the spacers (120). For example, forming the spacers (120) simultaneously using an evaporative material deposition on the substrate (130) surface will generally result in the spacers (120) having essentially identical heights. Alternatively or additionally, post-processing of the grown and/or deposited spacers (120) such as, but not limited to, micro-machining (e.g., chemical-mechanical polishing, etc.) may be employed to further adjust spacer height to achieve uniform height among the spacers. Similar methods may be employed to form the spacers (120) on or as an integral part of the mold (110).

In yet other embodiments, the spacers (120) may be separately fabricated and then affixed to one or both of the mold (110) and the substrate (130) using glue, epoxy or other suitable means for joining. However, whether fabricated as an integral part of, or affixed to, one or both of the mold (110) or the substrate (130), the spacers (120) are so fabricated or affixed prior to performing contact lithography.

In some embodiments, the deformable spacer (120) may exhibit one or both of plastic deformation and elastic deformation. For example, in a plastic deformation of the deformable spacer (120), a deforming force may essentially crush or smash the spacer (120). After being crushed or smashed, little or no significant recovery of an original shape of the spacer (120) will result when the deforming force is removed. In another example, the deformable spacer (120) may undergo an elastic deformation in response to the deforming force. During elastic deformation, the spacer (120) may bend or collapse but the spacer (120) will essentially return to its original shape once the force is removed. An elastically deforming spacer (120) may comprise a rubber-like material or spring-like material/structure, for example.

In various embodiments, the deformable spacer (120) provides one or both of passive deformation and active deformation. A passively deformable spacer (120) may exhibit one or both of plastic and elastic deformation. Materials having a spring-like behavior suitable for use as passively deformable spacers (120) that exhibit elastic deformation include various elastomeric materials. In particular, the spacers (120) may comprise an elastomeric material such as, but not limited to, nitrile or natural rubber, silicone rubber, perfluoroelastomer, fluoroelastomer (e.g., fluorosilicone rubber), butyl rubber (e.g., isobutylene or isoprene rubber), chloroprene rubber (e.g., neoprene), ethylene-propylene-diene rubber, polyester, and polystyrene. Non-elastomeric materials that are formed in a manner that facilitates spring-like behavior during passive deformation may be employed as well. Examples of non-elastomeric materials that can be formed into springs for use as the spacers (120) include metals such as, but not limited to, beryllium copper and stainless steel as well as essentially any relatively rigid polymer. In addition, many conventional semiconductor materials may be micro-machined into mechanical spring configurations. Examples of such materials include, but are not limited to, silicon (Si), silicon oxide ($SiO_2$), silicon nitride ($Si_3N_4$), silicon carbide (SiC), gallium arsenide (GaAs), and most other conventional semiconductor materials. Such non-elastomeric materials formed as springs may be used to produce passively deformable spacers (120) that exhibit one or both of plastic and elastic deformation depending on the specific shapes and forces employed.

In various embodiments, one or both of the mold (110) and the substrate (130) may be deformable. The deformable mold (110) and/or the deformable substrate (130) may exhibit one or both of plastic or elastic deformation. Furthermore, the deformable mold (110) and/or substrate (130) may provide one or both of passive or active deformation. In some embodiments, one or both of the mold (110) and substrate (130) may comprise materials described above with respect to the spacer (120) to achieve one or more of elastic, plastic, passive and active deformation.

A process and apparatus for contact lithography is further described in co-pending application Ser. No. 11/203,551 entitled "Contact Lithography Apparatus, System, and Methods" which is incorporated herein by reference in its entirety.

Figure 2:
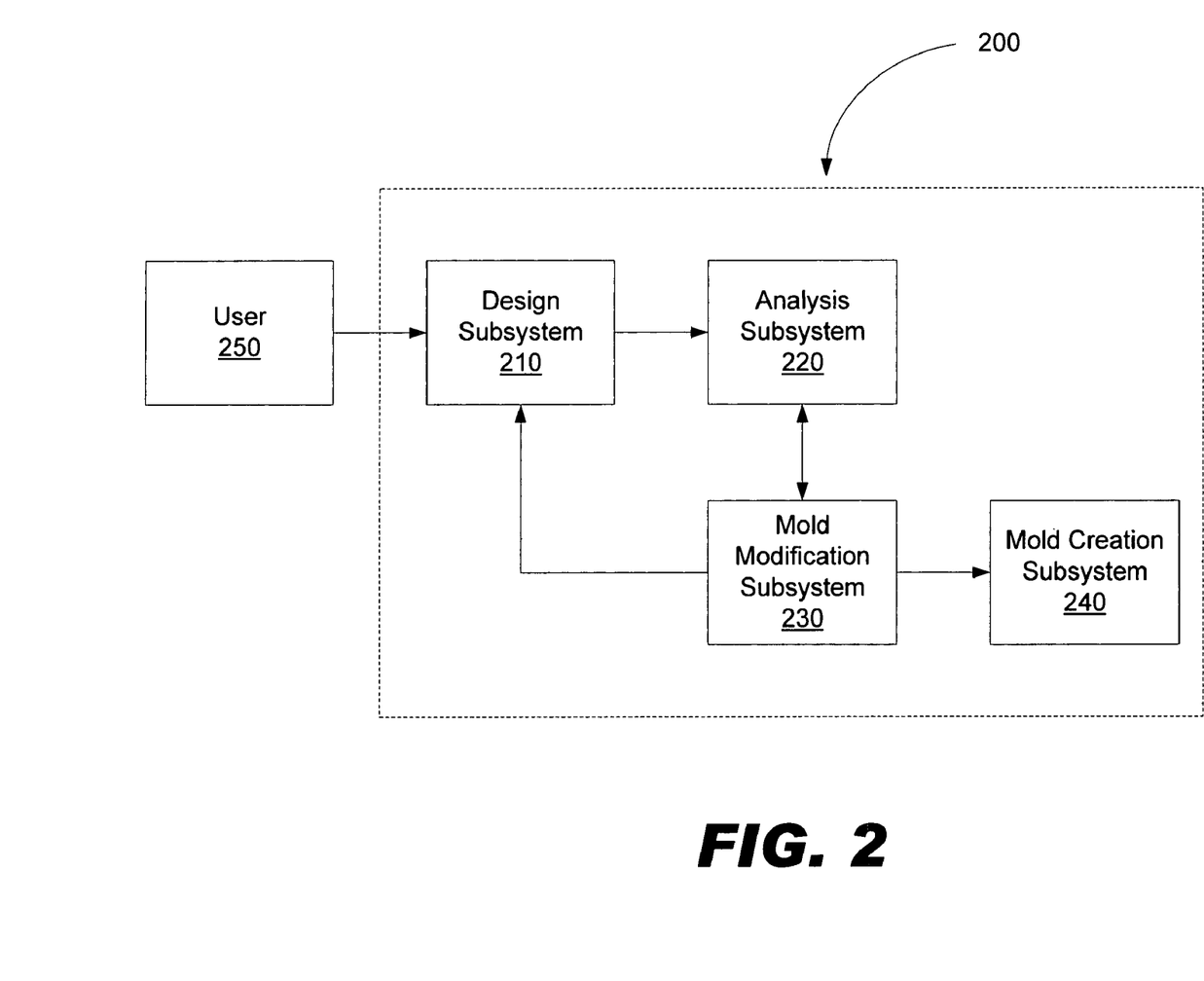
FIG. 2 is a block diagram illustrating a system of design for manufacturability for nanoimprint lithography molds according to one exemplary embodiment.

FIG. 2 is a block diagram illustrating a system of design for manufacturability for imprint lithography molds, according to the principles described herein. Although the elements of the system are illustrated as multiple subsystems, the system may alternately be implemented with two or more subsystems integrated into a single subsystem performing some or all of the functions described below. As used herein, a "device design" is the design for a device to be created through imprint lithography. Thus, the device design includes the desired characteristics, features, functionality, and structures that a user desires to create through imprint lithography. On the other hand, a "mold design" specifies the features of the mold used to create the desired device. Thus, the mold design includes the characteristics, structures, and pattern of the mold used to transfer the pattern that creates the desired device. While a device design and a mold design may have many corresponding features, the mold design may differ significantly from a device design or the reciprocal of a device design.

One embodiment of the system (200) includes a design subsystem (210), an analysis subsystem (220), a mold modification subsystem (230), and a mold creation subsystem (240). The design of a device to be manufactured and a corresponding imprint mold are generated by the design subsystem (210). The analysis subsystem (220) then analyzes the mold design to identify defects likely to occur during the manufacturing process. Data about predicted defects is then used by the mold modification subsystem (230) to alter the mold design to more accurately transfer the pattern desired by compensating for the predicted defects. Once a mold has been corrected to minimize the quantity and severity of defects created, the mold creation subsystem (240) physically creates the mold. According to one exemplary embodiment, each subsystem receives data describing the mold design as well as the device design. Consequently, the "design for manufacturability" system (200) ensures that mold modifications to improve manufacturability do not alter critical aspects of the structure and functionality of the imprinted device.

As illustrated, a user (250) provides input to the design subsystem (210) in order to specify the characteristics of the device to be created through imprint lithography, e.g., nanoimprint lithography. The design subsystem (210) may employ various levels of abstraction and/or receive various types of input specifying structure, functions, or other aspects of a device design. The design subsystem (210) may then generate a mold design from the device design information received. One embodiment of the design subsystem (210) may receive a set of functions and structures for a device and automatically generate a mold design matching the criteria received. According to another embodiment, the design subsystem (210) may receive data describing a previously generated mold design.

According to one exemplary embodiment, the design subsystem (210) includes at least one user interface for a user to input and manipulate device or mold design data. Another embodiment may provide an interface to a user to manipulate the individual structures and features of a device or mold to customize the size, shape, orientation, and other properties of the device or pattern.

The design subsystem (210) may also be communicatively coupled to one or more additional software programs or subsystems to receive design data, with or without direct data entry by a user. A number of electronic design automation (EDA) and computer aided design (CAD) programs may communicate with the design subsystem (210), including, but not limited to, programs for circuit design, verification, synthesis, layout, simulation, emulation, modeling, and other design tasks. By importing data from other design tools, the design subsystem (210) may minimize the duplication of work through the use of previously generated results. Users may also appreciate the flexibility to use familiar interfaces of other design tools as well as the interface provided by the design subsystem (210). Additionally, one or more of the design tools mentioned above may be integrated into the design subsystem (210) to increase the efficiency of the design process.

The design subsystem (210) may be configured to read and write design data in a number of formats, including, but not limited to, Graphic Design System 2-4 (GDSII-GDSIV), Open Artwork System Interchange Standard (OASIS), Caltech Intermediate Format (CIF), Manufacturing Electronic Beam Exposure System (MEBES), Electronic Design Interchange Format (EDIF), and proprietary formats. The various subsystems of the design for manufacturing system (200) may share information through one or more of the above file formats or through additional data structures or other means.

The design subsystem (210) creates an initial mold design based on data received from a user and any supporting programs, subsystems, databases, or data files. The design of a device and mold may be influenced by constraints or properties of the imprint process for which a mold is intended. Factors such as the resolution of a process, alignment accuracy, size constraints, types of resist used, resist curing methods, and other process-specific factors may significantly affect the design of a mold. For example, deposition of material onto a substrate and etching away a substrate would use opposite resist patterns and opposite molds to create the same imprinted structure. Also, a mold for use with a resist cured by ultraviolet light may include regions transparent to ultraviolet light, while a mold for use with a thermally cured resist may not.

The design subsystem (210) may also determine potential improvements to a device design and consequently a mold design in order to increase the performance of the device to be created. By analyzing parasitic capacitance and inductance in a mold for an electric circuit, for example, the design subsystem (210) may identify potential design enhancements to increase the effective average speed of the circuits produced. Attention to electrical or other properties inferred from a device design or mold design may enhance performance of the device produced.

The design subsystem (210) may additionally apply one or more policies to verify one or more aspects of a design. For example, when a design includes an electronic circuit, the design subsystem (210) may detect and alert the user of short or open circuits, unintended inductive or capacitive coupling or other design flaws. The application of a set of policies or design rules, as is well known, may ensure the accuracy of a design and/or compliance with implementation requirements. A user may also be alerted when a structure or element is designed outside the capabilities of a manufacturing process. With each warning or error message, the design subsystem (210) may suggest improvements or corrections which may be approved by a user. Generally, these design adjustments correct flaws in a design and adapt the design for a desired imprint process.

Modifications to a mold design to improve the yield of imprinted devices and the quality of the mold may be performed later by the mold modification subsystem (230). According to one embodiment, however, the design subsystem (210) may incorporate substantial functionality to minimize manufacturing defects arising from the use of the mold being designed. Alternately, the design subsystem (210) and mold modification subsystem (230) may be combined physically, logically, or functionally into a single subsystem.

An initial mold design generated by a design subsystem (210) is transmitted to an analysis subsystem (220). The analysis subsystem (220) simulates and analyses a mold design and predicts the patterns and features most likely to cause defects during the imprint process. In the specification and appended claims, the term "means for predicting distortions" refers to elements or methods used, separately or in combination, to predict distortions in transferring a pattern from a mold to a substrate during a contact lithographic process. Defect predictions may be based on finite element analysis (FEA), fluid dynamics simulations, or other simulation or modeling approaches, including those calculating stress, strain, or other properties of a mold, resist, substrate, imprinted structure, and/or other elements of the imprinting process. Simulations may consider static relationships as well as dynamic interactions anticipated during the imprint process. The analysis subsystem (220) may also compare design features with database records of common defects and associated causes to identify yield-limiting features of a mold design.

In some embodiments, the analysis subsystem (220) identifies features of a mold design that are likely to cause defects in an imprinted pattern when a mold is eventually created or used. In other embodiments, the analysis subsystem (220) additionally identifies potential defects in a mold, such as imperfections created during the creation of a mold. Furthermore, the analysis subsystem (220) may also identify features or aspects of a mold design that may be improved to facilitate the creation of a mold or the use of a mold, by increasing speed, accuracy, fidelity, or other characteristics.

According to another embodiment, the analysis subsystem (220) may identify features of a mold design limiting the speed of the imprint process. A simulation may reveal, for example, that a long, narrow path for resist to flow increases the time that a particular mold would be required to remain in contact with a substrate.

The analysis subsystem (220) may also analyze effects characteristic of a specific imprint process. In one exemplary imprint process, a region of a mold or substrate may be deformed in a consistent manner from one imprint to the next. The analysis subsystem (220) may use this or other known process characteristics to determine any adverse effects of a particular mold design to an imprinted device.

The analysis subsystem (220) may calculate that some shapes or geometries may be difficult to form with a particular imprint process. For example, concentric rings may block a liquid resist from flowing to the center of a circular region. Sharp corners or other angles may also be difficult to form, since resist material may not correctly flow or conform to each edge. These and other structures which may not accurately transfer to a substrate may be identified for later correction by the mold modification subsystem (230).

In one exemplary embodiment, the analysis subsystem (220) prioritizes potential defect-prone aspects of a design according to severity or frequency of anticipated distortions identified during simulation. This prioritization may take the form of an ordered list, an indicator associated with each design flaw, hierarchical sets or trees, or other data structure. Each identified design flaw may also be assigned a probability or indication of the expected frequency predicting how often a certain defect may occur during the use of a mold based on the simulated design.

Once potential defects are identified by the analysis subsystem (220), a mold modification subsystem (230) makes adjustments to the mold design to minimize the probability and severity of the potential defects. The mold modification subsystem (230) may receive data describing the device design, the current mold design, the intended manufacturing process, design constraints or process constraints, potential defects, simulation results, or other data that may enable the design modification subsystem (230) to effectively enhance a mold design. This data is used to correct the mold design or compensate for factors that reduce the effectiveness of a mold. In the specification and appended claims, the term "means for modifying a mold" refers to any elements or methods used, separately or in combination, to modify a mold to compensate for distortions. While correcting a mold to eliminate expected defects, the mold modification subsystem (230) preserves the critical aspects of the underlying device design so that the functionality of the device produced by the mold is maintained. The mold modification system (230) alters a mold design so that the imprinted pattern more closely matches the desired device design.

According to one embodiment, the mold modification subsystem (230) may offset mold structures and pattern elements to improve the anticipated yield of devices manufactured with a mold. Design features may be offset laterally on the patterned area (112, FIG. 1) of a mold, and may also be raised or lowered to alter the depth of a pattern. The thickness, spacing, shape, and other aspects of a pattern may also be adjusted to improve the quality of imprints using the mold.

For example, a specific imprint process may consistently cause elastic deformation of a mold at the edges of the patterned region. The analysis subsystem (220) may indicate that one or more mold structures in the region of the deformation are likely to create distorted or damaged structures during the imprint process. The mold modification subsystem (230) may then relocate the design pattern from the region of deformation to a different region of the mold where deformation is less pronounced. Alternately, the mold modification subsystem (230) may deepen or widen the pattern in the deformation region to lessen the impact of the deformation on the yield of devices created by the mold.

Many other modifications may be made to improve a mold, either to a section of a mold or to the entire patterned region (112, FIG. 1). The mold modification subsystem (230) may also alter mold structures to improve the flow of a resist, equalize the density of features in a region, or compensate for other factors such as stress, resist viscosity, substrate imperfections, or thermal expansion of a substrate, resist, or mold.

Since many devices require the use of multiple molds, the analysis subsystem (220) and/or mold modification subsystem (230) may reference data from other mold designs or databases when appropriate. Each element of the system may also correlate a mold design with process characteristics, desired imprint patterns, related molds, or other data to ensure that specifications or requirements are met.

The analysis subsystem (220) and the mold modification subsystem (230) may perform several iterations of analysis and correction on a mold design. Once the mold modification subsystem (230) alters the mold design subsystem (220), simulation of the altered design may ensure that no new flaws were introduced and that the original defects were corrected. Additional corrections may be desired in light of the second round of simulations, and the process may continue until a certain condition is reached, such as a pre-determined number of iterations or a given tolerance or defect probability.

The mold modification subsystem (230) may transmit some or all of a mold design to the design subsystem for further processing. A user may consequently view changes made by the mold modification subsystem (230) or other subsystems. Some defects identified by the system may require changes that may affect the functionality of the device generated from the mold. It is desirable that a user be notified and be given an opportunity to correct the device design when necessary. According to one exemplary embodiment, a user may be presented with a description of the design elements under review, an explanation of predicted defects and causes, one or more suggestions to improve the design, and notification of tradeoffs that may limit the performance or manufacturing capabilities. With this information, a user may select a suggested correction to the design, manually alter the design to avoid the associated manufacturing or design issue or choose to ignore the particular issue identified.

As illustrated, a mold creation subsystem (240) receives the final mold design from the mold modification subsystem (230) and creates a physical mold. The process used to create the mold may include, but is not limited to, electron beam etching, optical lithography, solid freeform fabrication or other semiconductor or mold fabrication steps. The methods employed in the mold creation subsystem may vary according to the intended use of the mold and the specific imprint process to be employed. The mold creation subsystem (240) may refer to data generated by other subsystems in the "design for manufacturability" system (200), including data relevant to the manufacturing process. Data useful for mold creation may be provided explicitly through annotations or other data, or mold creation data may be inferred from other mold data.

The mold formed by the mold creation subsystem (240) is then used to transfer a pattern to an imprintable area (132, FIG. 1) of a receiving substrate. The mold created may be used to pattern a small area of a substrate, such as in step-and-repeat lithography, or the mold may include a larger pattern to pattern a large portion of a substrate at once. According to one exemplary embodiment, certain aspects of a mold design may determine the time required for a mold to remain in contact with a substrate or for a resist to flow over the substrate through the mold. The imprint process may thus be optimized for a specific mold.

FIGS. 3A through 3D illustrate a number of nanoimprint molds, according to various exemplary embodiments.

Figure 3A:
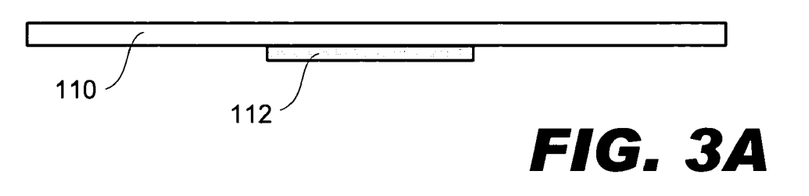
FIGS. 3A through 3D are schematic side views of nanoimprint lithography molds according to various exemplary embodiments.

As illustrated in FIG. 3A, a nanoimprint lithography mold (110) includes a patterned region (112) that is uncompensated for distortions or deformations experienced during the imprint process. The desired pattern is represented as a flat region at the bottom of the patterned region (112).

Figure 3B:
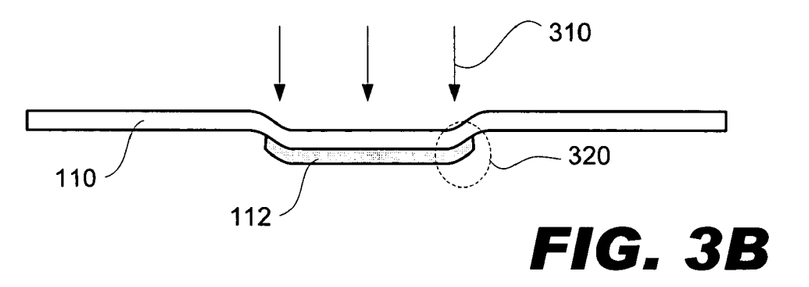

FIG. 3B illustrates the mold (110) of FIG. 3A experiencing a deformation due to a force (310). In one embodiment, the mold (110) and/or patterned region (112) may be deformed during the imprint process. Since the deformation pictured is not uniform across the patterned region (112), the pattern near an edge (320) is distorted. Instead of imprinting the desired flat surface with distinct edges, the mold of FIG. 3B would imprint a flat region with distorted edges (320).

Figure 3C:
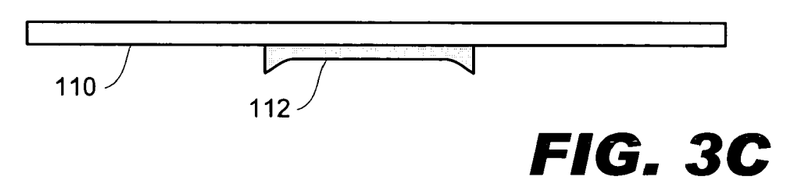

FIG. 3C illustrates a mold (110) corrected for the deformation illustrated in FIG. 3B. Since a deformation is anticipated near the edges of the patterned region (112), the edges of the patterned region (112) are vertically offset to compensate for the differential deformation.

Figure 3D:
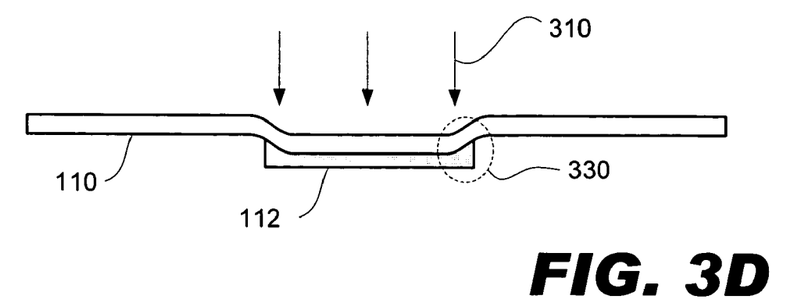

FIG. 3D illustrates the mold (110) of FIG. 3C experiencing the same deformation shown in FIG. 3B. Unlike the mold (110) of FIG. 3B, the mold of FIG. 3D has been designed to compensate for the imprint deformation and correctly transfers the desired pattern, including a distinct edge (330).

Figure 4A:
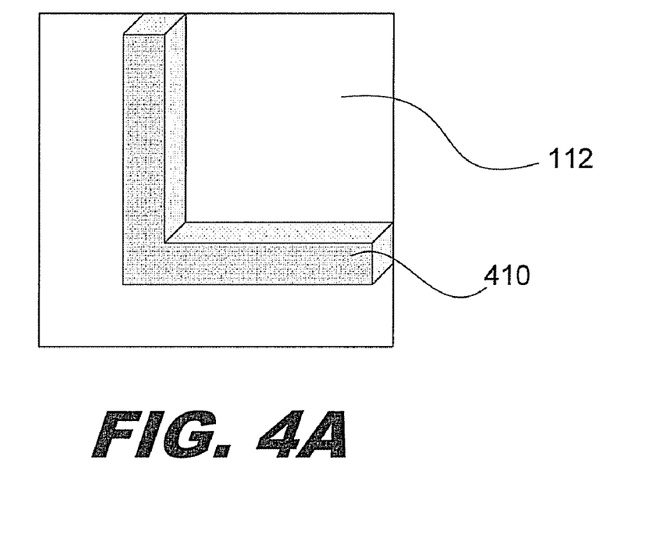
FIGS. 4A and 4B are schematic diagrams of nanoimprint lithography molds, according to various embodiments.

FIG. 4A illustrates a section of a patterned region (112) of a mold, according to one exemplary embodiment. The patterned region (112) includes a sharp corner (410) that may not transfer accurately during some imprint processes. For example, liquid resist material may not flow sufficiently to fill the corner, leaving a gap or other distortion in the imprint. Also, the structure may be excessively fragile to withstand the removal of the mold from the substrate in some embodiments.

Figure 4B:
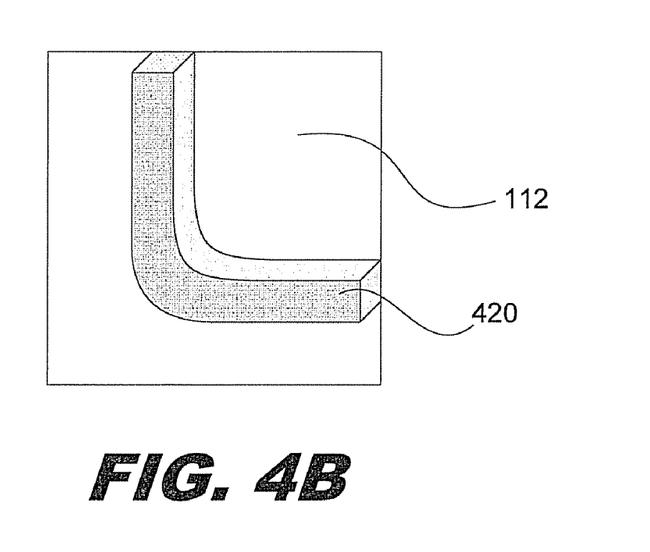

FIG. 4B illustrates a section of a patterned region (112) that has been adjusted to improve the manufacturability of devices created with the mold. The sharp corner (410) has been replaced with a curve (420) that, according to some embodiments, may enable improved resist flow or otherwise improve the fidelity or imprinted patterns. The smoothing of the corner (410) is only one of numerous enhancements that could be made to improve the manufacturability of a pattern. The adjustments made to a mold may depend on the specific pattern and imprint process for which the mold is designed.

Figure 5:
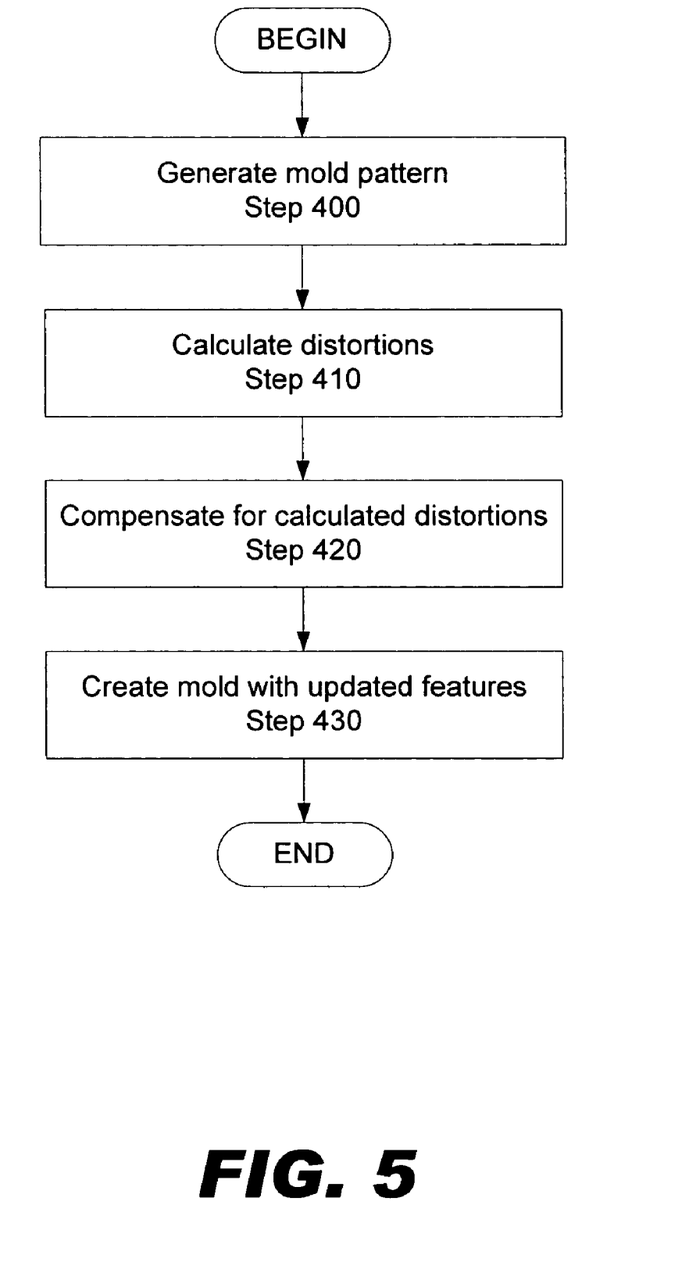
FIG. 5 is a flowchart illustrating a process of aligning and patterning a substrate with a mold according to one exemplary embodiment.

FIG. 5 is a flowchart illustrating a method of design for manufacturability for nanoimprint lithography molds, according to one exemplary embodiment.

First, an imprint pattern is generated (step 400). In some embodiments, the pattern may be the desired pattern to be created on a substrate. A pattern for a mold may then be generated from the device pattern. According to another embodiment, a mold pattern may be generated without first generating a device pattern.

Next, potential distortions in an imprinted pattern are predicted and calculated (step 410). Numerous calculation and simulation methods may be used to identify defect-prone aspects of a mold design.

With potential distortions identified, the mold design is adjusted to compensate for the various factors distorting an imprinted pattern (step 420). As mentioned above, adjustments to a mold design may affect the entire patterned region or individual structures or regions. The adjustments may include, but are not limited to, vertical offsets, lateral x-y offsets, size and shape alterations, or other modifications to a pattern. In some embodiments, changes to a pattern may substantially alter the structure or functionality of an imprinted device, and a user may be provided the option to reject or modify any changes that a user determines may negatively affect the imprinted device.

Once a mold design or mold pattern has been corrected for process effects and design flaws, the mold is physically created (step 430). The creation of the mold may facilitate the manufacturing process by taking into account the type of resist used, temperature requirements for a process, alignment methods, or other process characteristics.

In some embodiments, steps 410-430 may be repeated as desired to produce an iterative process that further refines the mold design. This may include further review of the updated features of step 430 to re-evaluate possible sources of distortion (step 410), providing additional compensating measures (step 420) and eventually creating mold with features (step 430) that have been refine a number of times to reduce or eliminate potential sources of distortion during pattern transfer.

The preceding description has been presented only to illustrate and describe examples of the principles discovered by the applicants. This description is not intended to be exhaustive or to limit these principles to any precise form or example disclosed. Many modifications and variations are possible in light of the above teaching.

What is claimed is:

1. A method of contact lithography comprising:
predicting distortions likely to occur in transferring a pattern from a mold to a substrate during a contact lithography process; and
modifying said mold to compensate for said distortions.

2. The method of claim 1, further comprising producing a device design for a desired device.

3. The method of claim 2, wherein said predicting distortions is performed using said device design.

4. The method of claim 2, further comprising producing a mold design based on said device design.

5. The method of claim 4, wherein said predicting distortions is performed using said mold design.

6. The method of claim 1, further comprising:
producing proposed modifications to said mold based on predictions of said distortions through a user interface; and
accepting user input implementing said proposed modifications or specifying other modifications, then performing said modifying of said mold in accordance with said user input.

7. The method of claim 1, wherein said predicting distortions is performed based on a lithography process to be employed.

8. The method of claim 1, wherein said predicting distortions is performed based on elements of said pattern likely to cause distortions.

9. A contact lithography system comprising:
a design subsystem configured to generate data describing a nanoimprint lithography pattern;
an analysis subsystem configured to identify one or more distortions likely to occur when pressing using a mold created from said data into a substrate; and
a mold modification subsystem configured to modify said data to compensate for said one or more distortions identified by said analysis subsystem.

10. The system of claim 9, further comprising a mold creation subsystem configured to produce a physical mold based on said data that has been modified to compensate for said one or more distortions.

11. The system of claim 9, further comprising a user interface configured to display to a user an identification of said one or more distortions and proposed modifications to compensate.

12. The system of claim 9, wherein said design subsystem is configured to receive data describing said lithography pattern from another design subsystem.

13. The system of claim 9, wherein said lithography pattern is a mold/resist lithography pattern.

14. The system of claim 9, wherein said analysis subsystem identifies distortions likely to occur as a result of a combination of factors comprising at least one of thermal expansion, chemical reactions, electrostatic effects, differential temperatures, deformation, adhesion, and fluid flow effects.

15. The system of claim 9, further comprising a database of known distortions occurring in contact lithography systems, wherein said analysis subsystem compares said data to said database to identify said one or more distortions.

16. The system of claim 9, wherein said mold modification system spatially offsets features of said lithography pattern to compensate for said one or more distortions.

17. The system of claim 9, wherein said design subsystem applies one or more design policies during generation of said data describing a lithographic pattern.

18. The system of claim 9, wherein said analysis subsystem prioritizes said one or more imprint distortions.

19. The system of claim 18, wherein said one or more imprint distortions are prioritized by one or more of severity, frequency, probability, location, magnitude, functional effect, physical properties, manufacturing process step, difficulty to correct, and user preferences.

20. A system of contact lithography comprising:
means for predicting distortions likely to occur in transferring a pattern from a mold to a substrate during a contact lithography process; and
means for modifying said mold to compensate for said distortions.

* * * * *